United States Patent
Eidelman

(10) Patent No.: US 6,749,900 B2
(45) Date of Patent: *Jun. 15, 2004

(54) METHOD AND APPARATUS FOR LOW-PRESSURE PULSED COATING

(75) Inventor: Shmuel Eidelman, Rockville, MD (US)

(73) Assignee: Science Applications International Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/438,978

(22) Filed: May 16, 2003

(65) Prior Publication Data

US 2003/0207042 A1 Nov. 6, 2003

Related U.S. Application Data

(63) Continuation of application No. 09/906,111, filed on Jul. 17, 2001, now Pat. No. 6,630,207.

(51) Int. Cl.[7] .............................. C23C 4/04; C23C 4/12; B05B 1/24
(52) U.S. Cl. ................ 427/447; 427/453; 427/450; 427/452; 427/455; 427/456; 118/302; 118/50
(58) Field of Search ................. 427/447, 450, 427/452, 453, 455, 456; 239/79; 118/50, 302

(56) References Cited

U.S. PATENT DOCUMENTS

| | | | |
|---|---|---|---|
| 2,714,563 A | | 8/1955 | Poorman et al. |
| 3,954,380 A | | 5/1976 | Valaev et al. |
| 4,004,735 A | | 1/1977 | Zverev et al. |
| 4,669,658 A | | 6/1987 | Nevgod et al. |
| 4,781,145 A | * | 11/1988 | Amlinsky et al. .......... 118/620 |
| 5,075,129 A | | 12/1991 | Jackson et al. |
| 5,123,835 A | * | 6/1992 | Richards et al. ............... 431/1 |
| 5,542,606 A | | 8/1996 | Kadyrov et al. |
| 5,855,827 A | * | 1/1999 | Bussing et al. ................ 264/7 |
| 6,025,034 A | * | 2/2000 | Strutt et al. ................. 427/450 |
| 6,503,575 B1 | * | 1/2003 | Payne et al. ................ 427/447 |

OTHER PUBLICATIONS

Metals Handbook Ninth Edition, vol. 5 "Surface Cleaning, Finishing, and Coating", 1982, pp. 364–365.*
G. B. Fagoaga et al., *The High Frequency Pulse Detonation (HFPD) Spray Process*, Aerostar Coatings, Fundaćion INASMET (Irun—Spain) 1996.
G. B. Fagoaga et al., *High Frequency Pulse Detonation (HFPD: Processing Parameters*, Aerostar Coatings, Fundaćion INASMET (Irun—Spain) 1997.
Metals Handbook Ninth Edition, vol. 5 "Surface Cleaning Finishing, and Coating,"1982, pp. 364–365.

* cited by examiner

*Primary Examiner*—Katherine A. Bareford
(74) *Attorney, Agent, or Firm*—Banner & Witcoff, Ltd.

(57) ABSTRACT

A coating material is deposited on a substrate by vacuum or low-pressure pulsed detonation coating. A detonation chamber receives a detonable mixture containing a coating precursor. The detonable mixture is ignited to produce detonation products laden with the coating precursor. The detonation products are accelerated in a low-pressure or vacuum chamber and discharged through a nozzle into contact with a substrate situated in low pressure to produce a high quality coating.

36 Claims, 3 Drawing Sheets

METHOD AND APPARATUS FOR LOW-PRESSURE PULSED COATING

CROSS REFERENCE TO RELATED APPLICATION

This application is a continuation of U.S. application Ser. No. 09/906,111, filed Jul. 17, 2001, now U.S. Pat. No. 6,630,207, the disclosure of which is hereby incorporated by reference in its entirety.

STATEMENT OF FEDERALLY SPONSORED RESEARCH

This invention was made pursuant to Contract No. N00014-01-C-0033, awarded by the Office of Naval Research, and therefore the U.S. Government may have certain rights in the invention.

FIELD OF THE INVENTION

The present invention is directed to coating technology and, more particularly, to pulsed detonation coating.

DESCRIPTION OF RELATED ART

Several techniques have been used to implement thermal spray coating. One approach has been High Velocity Oxygen/Fuel System (HVOF), in which solid particles are injected in high velocity gas produced by reaction of oxygen and a fuel at high pressure. Such systems typically are used for deposition at atmospheric pressure and primarily are used for coating metal alloys and WC/Co powders with particle sizes larger than about 10 $\mu$m. Other thermal spray coating techniques include plasma spray, in which particles are heated and accelerated by high temperature plasma produced by an electric discharge in an inert gas atmosphere. Plasma spray systems have been used for both atmospheric- and low-pressure coatings.

Plasma coating and HVOF coating suffer from several disadvantages. One disadvantage is the inability of directly using nanosized powder, or even small micron size (<10 $\mu$m) particles. This is due to the small particles closely following the streamlines of the carrying gas and decelerating significantly in the stagnation region of the jet/substrate interaction. The decelerated particles are susceptible to being diverted by the flow in the stagnation region, and are not deposited on the substrate. To help alleviate this problem, nanosized powders typically are post-processed to create 10–60 $\mu$m agglomerates that retain nanostructure and are strong enough to survive the jet environment before deposition. However, agglomeration not only adds to processing cost, but also can promote grain growth, contamination, and other deterioration of the original powders.

Thermal spray coating also has been implemented by intermittent detonations, e.g., by the use of a detonation gun (D-Gun). D-guns can be used for coating a wide variety of materials, such as metals, cermets, and ceramics. D-guns typically have a relatively long (often about 1 m), fluid-cooled barrel having a small inner diameter of about one inch. Typically, a mixture of reactive gases, such as oxygen and acetylene, is fed into the gun along with a comminuted coating material in two phases. The reactive gas mixture is ignited to produce a detonation wave, which travels down the barrel of the gun. The detonation wave heats and accelerates the coating material particles, which are propelled out of the gun onto a substrate to be coated.

The detonation wave typically propagates with a speed of about 2.5 km/sec in the tube and can accelerate the particle-laden detonation products to a velocity of about 2 km/sec. However, coating particles never reach the velocity of detonation products due to inertia. In practice, particle velocities usually are lower than about 900 m/sec. The temperature of the detonation products often reaches about 4000 K. After the coating material exits the barrel of the D-gun, a pulse of nitrogen typically is used to purge the barrel. Newer designs of the D-guns allow operation frequencies of up to about 100 Hz. See, e.g., I. Fagoaga et al., "High Frequency Pulsed Detonation (HFPD): Processing Parameters" (1997).

One example of a gas detonation coating apparatus is illustrated in U.S. Pat. No. 4,669,658 to Nevgod et al. A barrel enclosed in a casing has annular grooves made on an inner surface of an initial portion thereof. A main pipe housing a spark plug and having annular grooves on its inner surface is inserted into the initial portion of the barrel. In operation, a gas supply means is turned on. The apparatus works in cycles, each cycle accompanied by gas flowing into the barrel and the main pipe through tubes, gas conduits, and additional pipes. After the gases fill the barrel, the gas mixture is ignited in each cycle with the aid of the spark plug. The detonation products are said to quickly heat up the walls of the barrel and the annular grooves.

According to Nevgod, the gases flowing into the barrel are heated up in two stages. During the first stage the gases are warmed up in the additional pipes heated up in cycles by the detonation products. The heat insulation tubes are said to prevent the pipes from cooling down. During the second stage, the gases are heated up in the barrel and partially in the main pipe. The annular grooves on the inner cylindrical surface of the initial portion of the barrel, the inner surface of the main pipe and on the inner surface of the cover on the end of the barrel, are said to enhance the efficiency of heat exchange with the gases due to an increase in the heat exchange area and due to gas turbulization. The gases are heated to a temperature approximating that of self-ignition. A plurality of ignition sites is provided to accelerate the burning process.

Presently available detonation coating technology suffers from several drawbacks. One major drawback is that the D-guns are bulky, with the barrel alone often being as much as 1 m in length. Because of the difficulties associated with handling the bulky D-gun, the D-gun often is held stationary while the substrate to be coated is moved relative to the barrel of the D-gun. This is especially problematic for coating larger-sized articles that cannot easily be moved. Another drawback is that the coating rate is limited by the relatively low operation frequencies. Increase of operation frequency is possible if a shorter barrel is used. However, a shorter barrel leads to decrease in particle velocity, due to shorter cycle time available for particle acceleration by detonation products, which in turn will reduce coating quality. Reduction of particle size to less than 10 $\mu$m will help particle acceleration by high-speed detonation products, however these particles will quickly decelerate in the stagnation layer when approaching the coated substrate, and thus will arrive to the substrate at low velocity.

It would be desirable to develop thermal spray coating technology that enables the use of a smaller coating apparatus, especially one that can be adapted for coating the insides of tubes and other difficult-to-reach areas. Because for many applications coating quality improves with reduction of grain and particle size and with increase of particle impact velocity, it would be desirable to directly coat small-micron, sub-micron, and nanoscale particle that impact the substrate at very high velocities. It would be desirable to directly coat small-micron and sub-micron sized particles at very high velocities to give high quality cold coatings or impact coatings. It would be desirable to minimize the amount of local heating of the substrate surface during coating to enable the coating of very thin and/or low melting point substrates.

SUMMARY OF THE INVENTION

The present invention is directed to a method and apparatus for producing a coating on a substrate situated in vacuum or low pressure by pulsed detonation coatings. A pulsed detonation gun comprises a detonation chamber having ignition means and an outlet nozzle. In one preferred embodiment, a detonable mixture containing the coating precursor is formed in the detonation chamber. The detonable mixture is ignited to produce detonation products containing the coating precursor. Following detonation, the detonation products containing the coating precursor particles are discharged through the nozzle and expand at high velocities in a vacuum or low-pressure chamber. The coating precursor particles are heated and accelerated toward a substrate to produce a high quality coating.

According to another preferred embodiment, a suspension of a coating precursor in a detonable fuel is injected into a detonation chamber to form a detonable mixture. The detonable mixture is ignited to produce detonation products containing the coating precursor. The detonation products containing the coating precursor are discharged from the detonation chamber and accelerated in a low-pressure chamber. The detonation products containing the coating precursor are contacted with a substrate to produce a coating on the substrate.

According to an alternative embodiment of the invention, a detonation chamber has a first region containing ignition means and a second region having a nozzle at an end portion thereof. A detonable mixture is injected into the first region of the detonation chamber. A coating precursor, which can be provided in an inert gas or in a suspension, is injected into the second region of the detonation chamber. The detonable mixture is ignited, creating a wave front that accelerates the coating precursor through the nozzle into a low-pressure chamber and into contact with a substrate to produce a coating.

The vacuum or low-pressure environment of the present invention provides a greater pressure gradient for the detonation products, e.g., compared to conventional pulsed coating processes performed at atmospheric conditions. The greater pressure gradients yield higher particle acceleration and velocities, which translate into the ability to reduce the overall size of the apparatus and improve coating quality. The apparatus of the present invention thus can be made substantially smaller in size than the conventional, bulky D-guns. The apparatus can be made portable and can be easily manipulated to accurately apply coatings to substrates having a wide variety of sizes and shapes. Maintaining low pressures near the substrate enables coatings of smaller particles, e.g., small micron or nanosized particles, by avoiding interference from the carrying gas, which will be at low pressure and low density at the substrate.

Local heating of the substrate can be reduced or substantially avoided by reducing the duration of the detonation period, i.e., the time of exposure to the high temperature detonation products. Preferably, any appreciable heating of the substrate is restricted to a very thin surface portion thereof. Optionally, the substrate surface can be subjected to rapid temperature quenching after each exposure to further minimize local heating. Reduced local heating advantageously enables the coating of very thin and/or low melting point substrates and permits higher coating rates.

BRIEF DESCRIPTION OF THE DRAWINGS

The present invention will now be described in more detail with reference to preferred embodiments of the invention, given only by way of example, and illustrated in the accompanying drawings in which:

FIG. 1B illustrates ignition and detonation of a detonable mixture in a detonation chamber. FIG. 1C illustrates detonation products laden with a coating precursor expanding in a vacuum chamber.

DETAILED DESCRIPTION OF THE INVENTION

Figure 1A:
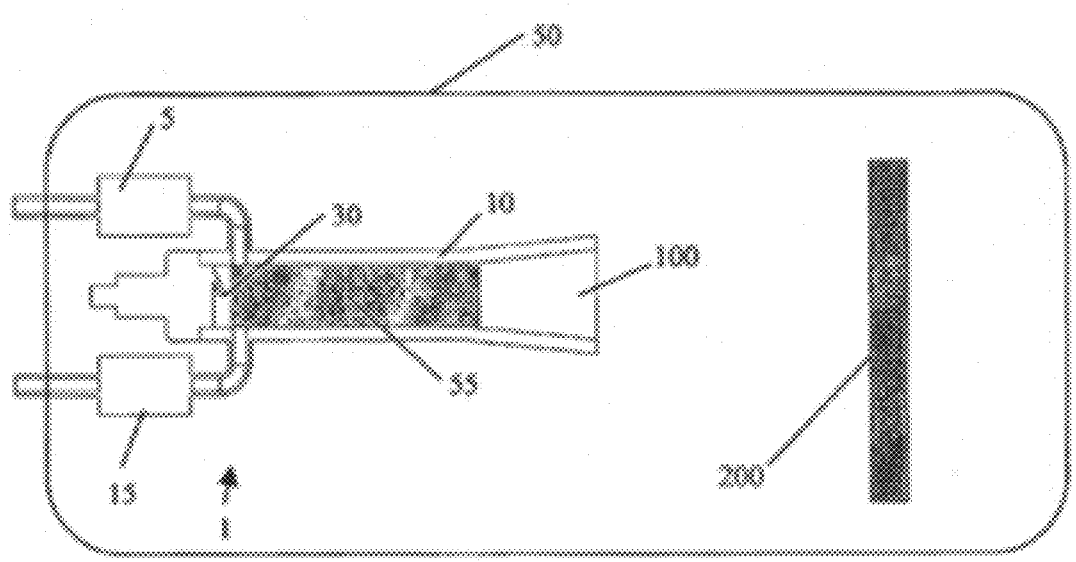
FIG. 1A is a schematic illustration of a pulsed detonation coating apparatus in accordance with a preferred embodiment of the invention.

The coating process and apparatus of the present invention has utility in applying a wide variety of coating materials to a wide variety of substrates. By way of example, nanoscale ceramic particles can be coated onto lightweight, low melting point metals used in aircraft structures to impart erosion and corrosion resistance. Lightweight composite materials can be coated with hard ceramic or metal particles to increase abrasion resistance. Another example is coating battleship metal surfaces with tough and hard ceramic nanoscale coatings to eliminate the need for painting and reduce the amount of labor and material needed for maintenance.

With reference to FIG. 1, an exemplary pulsed detonation coating apparatus (1) of a preferred embodiment of the present invention includes a detonation chamber (10) for receiving a detonable mixture (55) containing one or more coating precursors. The detonation chamber (10) has a nozzle (100) for discharging detonation products laden with the coating precursor(s) toward a substrate (200). An oxygen valve (5) and a fuel valve (15) are provided for controlling flow of oxidizer and fuel, respectively, into the detonation chamber (10). Examples of fuels that can be used include, but are not limited to, those detonable in mixtures with oxygen such as hydrogen, methane, propane, acetylene, or propylene. Also, detonable mixtures of liquid fuels and oxygen can be used, e.g., kerosene/oxygen, alcohol/oxygen, benzene/oxygen and other similar mixtures. In addition, some detonable monopropellants can be used, such as nitromethane, nitroglycerin, or similar single-component fuels that can be detonated. Selection of a suitable fuel will be apparent to persons skilled in the art and forms no part of the present invention.

The term "detonable mixture," as used herein, refers to the components present in the detonation chamber at the time of detonation. One example of a detonable mixture is an oxidizer, a fuel detonable in mixtures with oxygen, and a coating precursor. Another example of a detonable mixture is a monopropellant and a coating precursor. As another example, when a coating precursor is used as a fuel, a detonable mixture can comprise the detonable coating precursor and an oxidizer.

The coating precursor can comprise, by way of example, particles such as metals, cermets, ceramics, or combinations thereof. Non-limiting examples of metalorganic compounds that can be used include silane, disilane, germane, tungsten hexaflurade, trimethylboron, cadmium acetate, magnesium ethoxide, tantalum V-methoxide, tungsten V-ethoxide, zinc naphenate, and zirconium n-butoxide. Many coating precursors, such as the aforementioned metalorganic compounds, can also function as a detonable fuel.

The size of the coating precursor particles can vary over a wide range. Often the mean particle size is about 50 $\mu$m or less. Smaller micron particle sizes also can be used, such as those having a mean particle size of less than about 20 $\mu$m or 10 $\mu$m. In one embodiment of the invention, sub-micron sized particles can be used, having a mean particle size of less than 1 $\mu$m, and can have a mean particle size as small as about 100 nm, 10 nm, or less. The coating precursor typically is supplied in an inert liquid or gaseous carrier, such as water, nitrogen, argon, or helium.

The coating precursor can be co-injected into the detonation chamber (10) together with the detonable mixture (55). Alternatively, the coating precursor can be mixed with the fuel. Optionally, two or more coating precursors can be alternatively injected into the detonation chamber (10). The changing from one coating precursor to another coating precursor can be done at predetermined intervals (e.g., alternating each detonation, every other detonation, every fifth detonation, etc.) or can be actuated manually by an operator. Multiple coating precursors may be used, for example, to create a complex multi-layered coating material on a substrate using a single coating apparatus.

In an alternative embodiment of the invention, a suspension of the coating precursor and fuel is injected into the detonation chamber (10). The suspension can be mixed with an oxidizer in the detonation chamber (10) to form a detonable mixture (55). If the fuel is a monopropellant, the suspension can be injected, dispersed, and ignited, e.g., the suspension can be the detonable mixture (55). This embodiment is particularly advantageous for the direct processing of nanoscale particles into coatings. The suspension provides for easy injection and uniform dispersion of the coating particles and avoids such problems as clogging of the particle injection line, e.g., resulting from particle agglomeration. Smaller particles also tend to be more reactive and thus difficult to handle. For example, sub-micron particles of Cu and Ti can self-ignite in air. Mixing the particles with fuel isolates the particles from atmospheric oxygen, reducing handling hazards.

In another embodiment of the invention, the coating precursor is injected in front of (downstream of) the detonable mixture. The coating particles can be injected, for example, in an inert gas or in a suspension. A first region of the detonation chamber (10) containing the ignition means (30) (e.g., left-hand side of apparatus shown in FIG. 1A) is filled with the detonable mixture. A second region of the detonation chamber (10) closer to the nozzle (100) (right-hand side of the apparatus shown in FIG. 1A) is filled with inert gas or liquid droplets laden with the coating precursor particles. Following detonation, the detonation products "push" and accelerate the coating particles, which are surrounded with the inert gas or liquid. A key advantage is that the inert gas or liquid surrounding the particles helps to avoid contamination of the particles during coating that can result, for example, from the particles reacting with oxygen present in the detonation products. The risk of such contamination generally is more prevalent when coating with smaller particles. This embodiment is particularly useful for the coating of nitrates, carbides, and other compounds that are susceptible to deterioration due to the inclusion of oxygen or oxides into the coating. Because the particles are insulated from the high temperature detonation products, the particles typically are not liquefied or even heated substantially. High particle velocities are achieved by expansion into the vacuum or low-pressure environment.

A suitable ignition means (30), such as a spark plug, is provided in the detonation chamber (10) to ignite the fuel, producing detonation products containing the coating precursor. The detonation reaction produces a brief period of extremely high temperature and high pressure inside the detonation chamber (10). Typical detonation temperatures are on the order of 4000 K, and pressures on the order of 20–30 atmospheres and higher. The period of each detonation typically is less than about $10^{-3}$ sec., preferably less than about $10^{-4}$ sec., and more preferably less than about $10^{-5}$ sec. As illustrated in FIG. 1B, ignition and detonation produces a detonation wave front (58) that propagates through the detonation chamber (10) toward the nozzle (100). It is preferred to minimize the period of detonation in order to reduce or avoid appreciable local heating of the substrate, and also to permit operation at high frequencies, e.g., as high as 1000 Hz or more. Minimizing the period of detonation also avoids or reduces particle grain growth, particularly with nanosized particles.

Figure 1B:
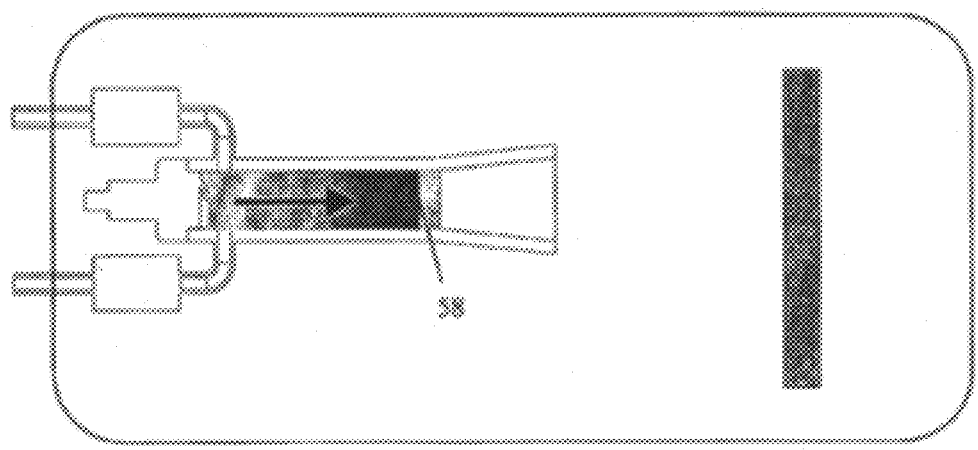
FIG. 1B and FIG. 1C illustrate a coating cycle for the coating apparatus illustrated in FIG. 1A.
Figure 1C:
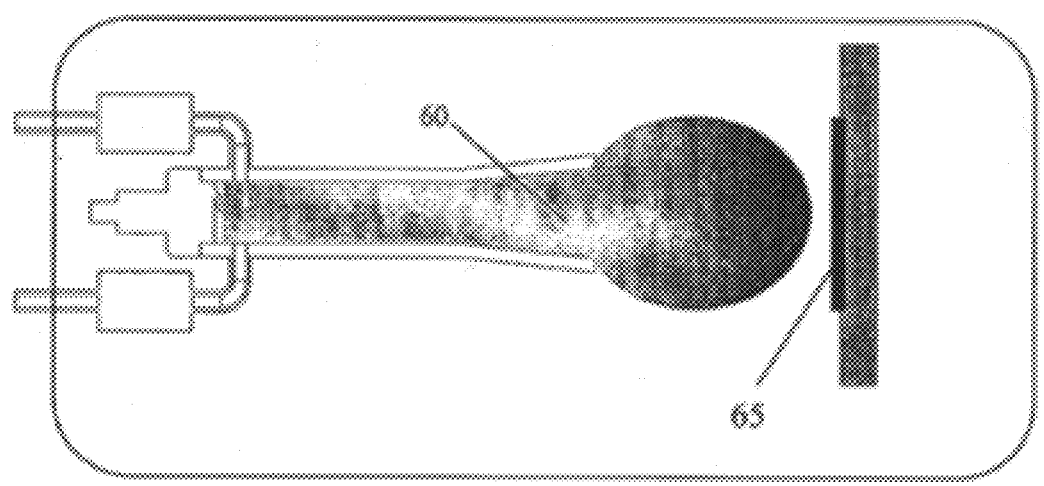

In a preferred embodiment illustrated in FIGS. 1A–1C, the pulsed detonation coating apparatus (1) is located in a low-pressure or vacuum chamber (50) that also contains the substrate (200) to be coated. The valves, controls, etc. preferably are disposed outside of the vacuum chamber (50) for easy operator access, while the fuel, oxidizer, inert gas/precursor materials, and ignition lines are fed through the low-pressure or vacuum chamber wall (50) without interfering with the vacuum or low-pressure environment. Suitable low-pressure or vacuum means (not illustrated) is provided for maintaining low-pressure or vacuum within the low-pressure chamber (50). The term "low pressure" is used herein to refer to pressure substantially lower than atmospheric and typically on the order of $10^{-1}$ of atmospheres and lower, often on the order of $10^{-2}$ to $10^{-3}$ atmospheres and lower. The term "vacuum" is used herein to refer to pressures of $10^{-6}$ atmospheres and lower.

As illustrated in FIG. IC, during the detonation coating cycle, precursor particles are accelerated to high velocities toward the substrate (200) via detonation products (60) laden with the coating precursor. The detonation products (60) expand from the high-pressure, high-temperature environment of the detonation chamber (10) to the low-pressure environment of the low-pressure or vacuum chamber (50). By maintaining low pressure near the substrate (200), it is possible to produce high quality coatings (65) using small-micron scale and even nanoscale-sized particles. The particles are effectively accelerated in the expanding detonation products and do not appreciably decelerate at the substrate because of the very small drag force in the low-density and low-pressure environment. In general, the drag force is smaller for smaller particles. In the low-pressure environment, the characteristic size of smaller (e.g., nanoscale) particles approaches that of the collision free path for molecules of the low-pressure carrying gas. Thus, small-micron size particles generally require lower pressures than do smaller, nanoscale particles for the same drag force at the substrate environment.

In the low-pressure chamber (50), the coating precursors are accelerated to high velocities. The particle velocities can vary over a wide range depending on such factors as particle size, detonation pressure, detonation temperature, and the pressure in the low-pressure chamber (50). Typical particle velocities in the practice of the present invention are in excess of about 2 km/sec., often 3 km/sec., 4 km/sec., 5 km/sec., or even higher. Because the high temperature detonation products heat the coating precursor particles, the coating particles generally are in a liquefied or semi-liquefied state. The low pressure provides a greater pressure gradient in relation to the detonation pressure, which imparts increased kinetic energy and impact energy to the coating particles, resulting in high quality coatings.

The detonation products containing the coating particles are discharged through the coating nozzle (100) and into contact with the substrate (200) to produce a coating (65). The coating nozzle (100) optionally is constructed so that it can be bent and displaced to a plurality of coating positions to permit the apparatus to be used for such applications as coating the inside surfaces of pipes and other difficult-to-reach portions of substrates. A converging nozzle (100) is shown in FIG. 1A for purposes of illustration. Other nozzle configurations can be used. For example, it may be desirable to employ a converging-diverging nozzle to prevent the detonable mixture and/or coating precursor material from escaping into the low-pressure chamber prior to detonation.

A key advantage of the present invention resides in effectively removing or reducing the amount of carrier gases from the detonation products as the detonation products are accelerated through the low-pressure chamber (50) toward the substrate (200), resulting in relatively low pressure at the substrate surface. This is particularly significant for coatings using small-micron and nanosized particles, which are particularly susceptible to being decelerated and diverted away from the substrate by turbulent gas flow in the vicinity of the substrate surface. Such a problem is encountered, for example, in conventional HVOF coating processes.

The pulsed detonation coating apparatus (1) of the present invention can be constructed substantially smaller than conventional D-guns. For example, the total length of the pulsed detonation coating gun (1) can be about 50 cm or less. Coating guns (1) can be constructed having a total length of about 25 cm or less. It is contemplated that coating guns (1) of the present invention can have a length as small as about 10 cm, 5 cm, or even less.

Optionally, cooling means (not illustrated) may be provided for cooling the various components of the device (1), for example after each detonation. An example of cooling means for a detonation coating apparatus is shown in U.S. Pat. No. 5,542,606, the disclosure of which is hereby incorporated by reference. However, it has been found that cooling the components is unnecessary in most cases due to the intermittent injection of the cool gases between exposures to the hot detonation products.

The intermittent detonations advantageously enable the surface of the substrate to cool between coated layers. This enables high deposition rates of coating materials, such as metals or ceramics, onto a wide variety of substrates, especially those, such as plastic, that have low melting point surfaces. If necessary, the surface of the substrate can be subjected to rapid temperature quenching, for example after each detonation exposure or at other suitable intervals. This can be done, for example, by intermittently spraying nitrogen onto the substrate surface between exposures. Quenching can be also achieved by injecting liquids such as water, ethyl alcohol, or inert gases such as helium or argon between the cycles into detonation chamber.

At particle velocities in excess of 2 km/sec., some particles will fuse into coatings, even at low temperatures, and create a strong bond with the substrate surface. Excessive heating of the substrate surface can result in previously coated layers can be damaged. By avoiding overheating of the substrate surface, the intermittent detonation process of the present invention permits high quality coatings to be applied at high coating rates.

While particular embodiments of the present invention have been described and illustrated, it should be understood that the invention is not limited thereto since modifications may be made by persons skilled in the art. The present application contemplates any and all modifications that fall within the spirit and scope of the underlying invention disclosed and claimed herein.

What is claimed is:

1. A method for producing a coating on a substrate using a pulsed detonation gun, the method comprising:

providing a pulsed detonation gun having a detonation chamber, wherein said detonation chamber comprises ignition means and a nozzle for discharging detonation products;

forming a detonable mixture containing at least one coating precursor in said detonation chamber;

igniting said detonable mixture to produce detonation products containing said coating precursor;

accelerating said detonation products containing said coating precursor under low pressure; and contacting said accelerated coating precursor with said substrate to produce a coating on said substrate.

2. The method of claim 1 wherein said at least one coating precursor is selected from the group consisting of metals, cermets, ceramics, and combinations thereof.

3. The method of claim 2 wherein said particles have a mean particle size of less than about 50 $\mu$m.

4. The method of claim 3 wherein said mean particle size is less than about 10 $\mu$m.

5. The method of claim 4 wherein said mean particle size is less than about 1 $\mu$m.

6. The method of claim 5 wherein said mean particle size is less than about 100 nm.

7. The method of claim 6 wherein said mean particle size is less than about 10 nm.

8. The method of claim 1 wherein said at least one coating precursor is a gaseous or liquid metalorganic compound selected from the group consisting of silane, disilane, germane, tungsten hexaflurade, trimethylboron, cadmium acetate, magnesium ethoxide, tantalum V-methoxide, tungsten V-ethoxide, zinc naphenate, and zirconium n-butoxide.

9. The method of claim 8 where said metalorganic compound is mixed into said detonable mixture.

10. The method of claim 9 where said metalorganic compound is used as fuel for detonation.

11. The method of claim 1 wherein said step of igniting said detonable mixture is intermittently performed at a frequency of from about 1 to about 1,000 Hz.

12. The method of claim 1 wherein the detonation products are accelerated under a pressure of less than about $10^{-1}$ atmospheres.

13. A method for producing a coating on a substrate using a pulsed detonation gun, the method comprising:

providing at least one coating precursor and a detonable mixture;

providing a detonation chamber having a first region containing ignition means and a second region having a nozzle for discharging detonation products;

injecting said detonable mixture into the first region of said detonation chamber;

injecting said coating precursor into the second region of said detonation chamber;

igniting said detonable mixture to produce detonation products, wherein said detonation products displace said coating precursor toward said nozzle;

accelerating said coating precursor under low pressure; and contacting said accelerated coating precursor with said substrate to produce a coating on said substrate.

14. The method of claim 13 wherein said at least one coating precursor comprises an inert gas or a suspension containing particles having a mean particle size of less than about 50 µm.

15. The method of claim 14 wherein said mean particle size is less than about 10 µm.

16. The method of claim 15 wherein said mean particle size is less than about 1 µm.

17. The method of claim 16 wherein said mean particle size is less than about 100 nm.

18. The method of claim 17 wherein said mean particle size is less than about 10 nm.

19. The method of claim 13 wherein the detonation products are accelerated under a pressure of less than about $10^{-1}$ atmospheres.

20. A method of producing a coating on a substrate using a pulsed detonation coating gun, the method comprising:

providing a pulsed detonation gun having a detonation chamber, wherein said detonation chamber comprises an igniter and a nozzle for discharging detonation products;

providing a suspension of at least one coating precursor in a detonable fuel;

injecting said suspension into said detonation chamber and forming a detonable mixture;

igniting said detonable mixture to produce detonation products containing said coating precursor;

accelerating said detonation products containing said coating precursor under low pressure; and contacting said accelerated coating precursor with said substrate to produce a coating on said substrate.

21. The method of claim 20 wherein said at least one coating precursor comprises particles selected from the group consisting of metals, cermets, ceramics, and combinations thereof, wherein said particles have a mean particle size of less than about 50 µm.

22. The method of claim 21 wherein said mean particle size is less than about 10 µm.

23. The method of claim 22 wherein said mean particle size is less than about 1 µm.

24. The method of claim 23 wherein said mean particle size is less than about 100 nm.

25. The method of claim 24 wherein said mean particle size is less than about 10 nm.

26. The method of claim 20 wherein the detonation products are accelerated under a pressure of less than about $10^{-1}$ atmospheres.

27. An apparatus for producing a coating on a substrate by a pulsed detonation coating, the apparatus comprising:

a pulsed detonation gun having a detonation chamber for receiving a detonable mixture and a coating precursor, wherein said detonation chamber comprises an igniter for igniting said detonable mixture and a nozzle for discharging detonation products from said detonation chamber toward a substrate; and a low-pressure chamber for accelerating detonation products containing said coating precursor discharged from said nozzle, wherein said low-pressure chamber is external to said pulsed detonation gun and wherein low pressure is maintained in said low-pressure chamber.

28. The apparatus of claim 27 wherein said ignition means intermittently ignites said detonable mixture at a frequency of from about 1 to about 1,000 Hz.

29. The apparatus of claim 27 wherein said low-pressure means maintains a pressure not exceeding about $10^{-1}$ atmospheres in said low-pressure chamber.

30. The apparatus of claim 27 wherein said nozzle is displaceable to a plurality of coating positions.

31. The apparatus of claim 27 wherein said nozzle comprises a converging nozzle.

32. The apparatus of claim 27 wherein said nozzle comprises a converging-diverging nozzle.

33. The apparatus of claim 27 wherein said pulsed detonation gun has a length of about 50 cm or less.

34. The apparatus of claim 33 wherein the length of said pulsed detonation gun is about 25 cm or less.

35. The apparatus of claim 34 wherein the length of said pulsed detonation gun is about 10 cm or less.

36. The apparatus of claim 35 wherein the length of said pulsed detonation gun is about 5 cm or less.

* * * * *